(12) United States Patent
Okada et al.

(10) Patent No.: US 6,489,677 B2
(45) Date of Patent: Dec. 3, 2002

(54) OPTICAL SEMICONDUCTOR DEVICE PACKAGE AND OPTICAL SEMICONDUCTOR MODULE HAVING THE SAME

(75) Inventors: Takahiro Okada, Tokyo (JP); Toshio Kimura, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/847,334

(22) Filed: May 3, 2001

(65) Prior Publication Data

US 2002/0027231 A1 Mar. 7, 2002

(30) Foreign Application Priority Data

May 11, 2000 (JP) ........................................ 2000-138639

(51) Int. Cl.[7] .............................................. H01L 23/34
(52) U.S. Cl. ...................... 257/712; 257/621; 257/680; 257/433; 257/448; 257/708; 257/698
(58) Field of Search ................................. 257/433, 498, 257/621, 680, 698, 708, 712; 385/137, 147

(56) References Cited

U.S. PATENT DOCUMENTS 5,337,388 A * 8/1994 Jacobowitz et al. ........... 385/76
5,559,918 A * 9/1996 Furuyama et al. ............. 385/92
5,671,315 A * 9/1997 Tabuchi et al. ............. 385/137

* cited by examiner

Primary Examiner—Richard Elms
Assistant Examiner—Douglas M Menz
(74) Attorney, Agent, or Firm—Oblon, Spivak, McClelland, Maier & Neustadt, P.C.

(57) ABSTRACT

An optical semiconductor device module includes an optical semiconductor device package, an optical semiconductor device such as a laser diode accommodated in the package, and a cooling area on an inner face of a metal bottom plate of the package and operable to cool the optical semiconductor device. A groove permitting molten solder to flow therein is formed in at least part of the solder joint area on the inner face of the metal bottom plate.

20 Claims, 4 Drawing Sheets

OPTICAL SEMICONDUCTOR DEVICE PACKAGE AND OPTICAL SEMICONDUCTOR MODULE HAVING THE SAME

BACKGROUND OF THE INVENTION

1. Technical Field

The present invention relates to an optical semiconductor device package, and more particularly, to an optical semiconductor device package which permits a cooling device for cooling an optical semiconductor device to be appropriately solder-joined thereto and an optical semiconductor device module having a package of this kind.

2. Related Art

In an optical communication system, optical semiconductor device modules are employed, which comprise a package and an optical semiconductor device accommodated therein for receiving and/or transmitting an optical signal. Although the optical semiconductor device constituting such a module is requested to produce a high power, it generates heat and is raised in temperature when operated at a high power level, so that its operation may become unstable. A similar problem can occur if the optical semiconductor device module is employed under high temperature circumstances. Thus, the optical semiconductor device module is generally provided with a cooling device for cooling the optical semiconductor device, thereby stabilizing the operation of the optical semiconductor device.

Figure 1:
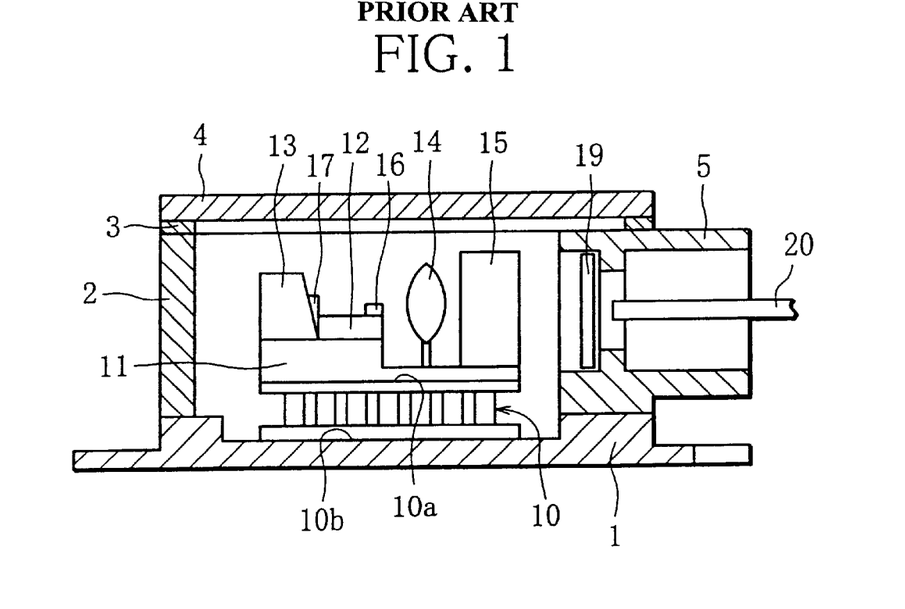
FIG. 1 is a longitudinal section view showing an example of an optical semiconductor device module.
Figure 2:
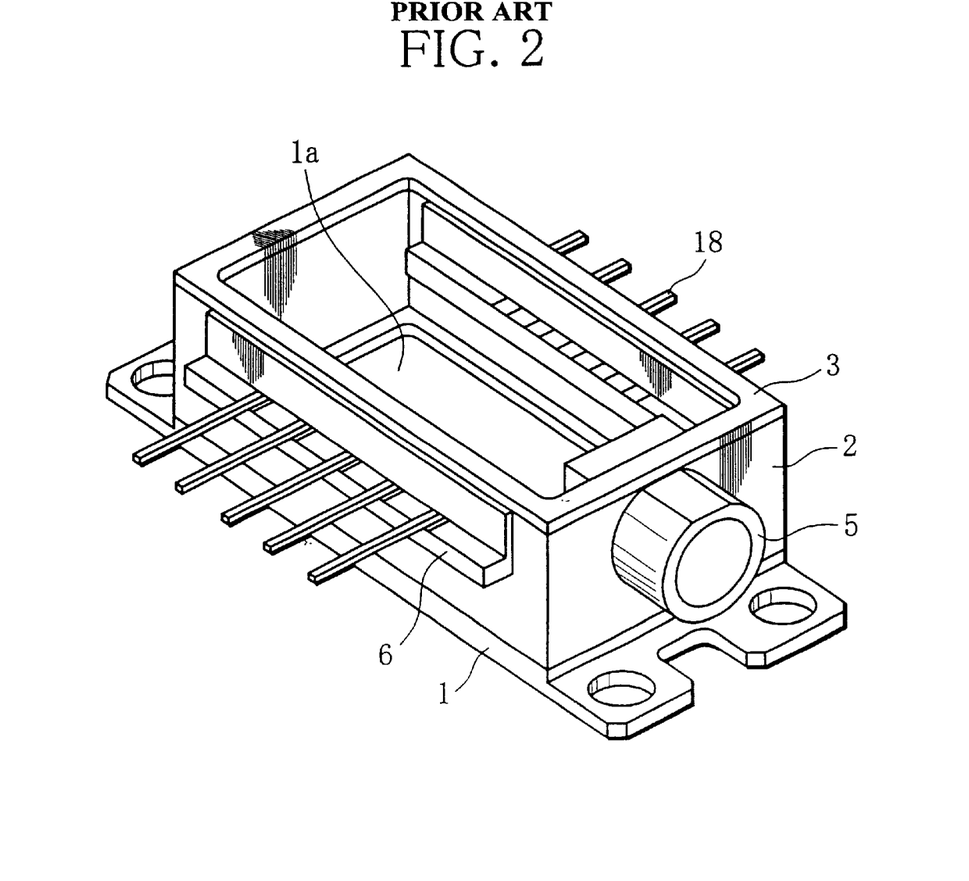
FIG. 2 is a perspective view of the package of the optical semiconductor device module shown in FIG. 1.

As this kind of optical semiconductor device module, a transmitter module shown in FIG. 1 is known. This transmitter module comprises, as shown in FIGS. 1 and 2, an optical semiconductor device package comprised of a metal bottom plate 1 and a metal frame 2 joined to an upper periphery of the bottom plate. The metal bottom plate 1 is ordinarily made of a Cu-W alloy and has a surface thereof plated with Au. The metal bottom plate 1 forms a package housing in conjunction with the metal frame 2 and a seal ring 3 joined to an upper face of the metal frame. The package housing accommodates therein module components such as an optical semiconductor device and a cooling device. The metal frame 2 has a right wall to which a hollow cylindrical window frame 5 is joined, and an optical fiber 20 is drawn out to the outside through a glass or sapphire window joined to the window frame 5.

In the illustrated optical semiconductor device module, a Peltier device 10 serving as the cooling device is solder-joined to an upper face of the metal bottom plate 1 in a state it is disposed in a recess 1a formed on that face, and a base 11 which is excellent in heat and electric conductivity is solder-joined to the upper face or cooling face 10a of the Peltier device 10. Furthermore, module components such as laser diode carrier 12, photodiode carrier 13, first lens 14, optical isolator 15 are solder-joined to the base 11, with these elements aligned with one another. Then, a laser diode (LD) 16 and a thermistor (not shown) for monitoring the temperature of the LD are solder-joined to the LD carrier 12, and a photodiode (PD) 17 for monitoring an LD light signal is solder-joined to the PD carrier 13. A second lens 19 is disposed inside the window frame 9. Leads 18 are supported by electrical signal input/output sections 7 of a ceramic material which are joined to notches formed in front and rear walls of the metal frame 2, respectively.

After the module components are received in the package housing, lead terminals of the LD 16 and respective one ends of the leads 18 are electrically connected to each other by means of wires, not shown, to thereby make it possible to transfer electric signals between the LD 16 and external devices through the leads 18.

Finally, a metal lid 4 is seal-welded to the metal frame 2 through the seal ring 3, whereby the fabrication of the optical semiconductor device module is completed. The metal lid 4 may be directly seal-welded to the metal frame 2 without using the seal ring 3.

The Peltier device 10 comprises, for instance, two insulating layers and P-type and N-type thermoelectric conversion devices that are alternatively arranged between the insulating layers and electrically connected in series with one another. The two insulating layers have functions of generating and absorbing heat at their surfaces, respectively, when a DC voltage is applied to the thermoelectric conversion devices. Outputs from the thermistor and the PD are employed for temperature control and constant optical-output control in the optical semiconductor device module, respectively.

With the optical semiconductor device module having the above construction, heat generated by the LD 16 is transferred to the cooling face 10a of the Peltier device 10 through the LD carrier 12 and the base 11 and then dissipated to the outside through the heat generating face 10b of the Peltier device 10 and the metal bottom plate 1 serving as a heat sink, if the Peltier device 10 is appropriately solder-welded to the metal bottom plate 1, thereby preventing the LD 16 from becoming excessively high in temperature. However, an improper soldered joint may be formed between the metal bottom plate 1 and the Peltier device 10 for the following reasons.

In conventional solder joining processes, the cooling device such as a Peltier device 10 is placed on a solder foil of 20 to 50 $\mu$m thick disposed on the metal bottom plate 1, and then the solder foil is heated to melt while pressing the Peltier device 10 by means of a weight, not shown, placed thereon. As the solder foil is heated and raised in temperature, the plated Au on the surface of the metal bottom plate 1 diffuses into the solder foil, so that the melting point of the Au diffusion part of the solder foil becomes high. The high melting point part cannot melt during the process of solder-joining the metal bottom plate 1 and the Peltier device 10, and hinders the spread and wetting of molten solder between the opposite faces of the metal bottom plate 1 and the Peltier device 10 to thereby form air spaces or voids therebetween. As a result, unmelted parts of the solder foil and voids remain between the metal bottom plate 1 and the Peltier device 10 after completion of the solder joining process.

Since the adhesion between the metal bottom plate 1 and the Peltier device 10 is lowered by the unmelted parts and the voids, there occurs a deterioration in heat transfer between the metal bottom plate 1 and the heat generating face 10b of the Peltier device 10 whose cooling face 10a receives heat generated by the LD 16. Thus, the Peltier device 10 cannot fully dissipate heat and is deteriorated in its cooling ability, so that the LD 16 is raised in temperature and becomes unstable in operation. If unmelted solder or a void is present between the metal bottom plate 1 and the Peltier device 10, the Peltier device 10 and the LD 16 are inclined relative to the metal bottom plate 1 so that the optical axis of the LD 16 goes out of alignment, causing improper optical signal transmission in the optical semiconductor device module.

To prevent the solder foil from increasing in melting point attributable to diffusion of Au thereinto, if a countermeasure such as to increase the thickness of the solder foil, i.e., the solder joint layer between the metal bottom plate 1 and the Peltier device 10 is taken, a tilt of the Peltier device 10 relative to the metal bottom plate 1 is liable to become large, and if another countermeasure such as to decrease an amount of Sn in the solder foil is taken, the adhesion between the metal bottom plate 1 and the Peltier device 10 is lowered since the melting point of the solder foil excessively decreases at parts other than Au diffusion parts of the solder foil. Thus, these countermeasures are not useful to attain an improved solder joint between the metal bottom plate and the Peltier device in the optical semiconductor device module and at the same time reduce the tilt of the Peltier device relative to the metal bottom plate.

SUMMARY OF THE INVENTION

An object of the present invention is to provide an optical semiconductor device package permitting a cooling device for cooling an optical semiconductor device to be properly solder-joined thereto, and an optical semiconductor device module having this kind of package.

According to one aspect of the present invention, there is provided an optical semiconductor device package which includes a metal bottom plate having an inner face thereof including a solder joint area for solder joint between the metal bottom plate and a cooling device for cooling an optical semiconductor device, a metal frame joined to a peripheral portion of the inner face of the metal bottom plate and cooperating with the metal bottom plate to define an accommodation space for accommodating therein the optical semiconductor device and the cooling device, a window frame formed integrally with the metal frame and employed for optical signal transmission between the optical semiconductor device and an external device, and an electric signal input/output section formed integrally with the metal frame and employed for electric signal transmission between the optical semiconductor device and an external device. The optical semiconductor device package of this invention has an improvement in that at least one groove permitting molten solder to flow therein is formed in at least part of the solder joint area on the inner face of the metal bottom plate.

With the package of the present invention, when solder is heated to melt in the groove formed on the inner face of the metal bottom plate in order to produce a solder joint between the metal bottom plate and the cooling device, molten solder flows in the groove and penetrates into between opposite faces of and permeates into surface layers of the metal bottom platen and the cooling device.

In making a solder joint between the cooling device and the metal bottom plate of the package of this invention, plated Au on the surface of the metal bottom plate diffuses into solder which is being subject to heating, as in the case of the conventional package. However, an amount of solder useable for the formation of the solder joint for the package of this invention is larger by an amount flowing in the groove than that for the conventional package, and hence the concentration of Au in the solder joint layer becomes smaller, if the solder joint layers to be formed between the metal bottom plate and the cooling device are identical in thickness for both the packages. As a result, occurrences of unmelted solder and voids in the solder joint layer due to an increased melting point of solder are prevented or suppressed, and hence the adhesion between the metal bottom plate and the cooling device through the solder joint layer is enhanced, whereby the cooling device adequately achieves the effect of cooling the optical semiconductor device. In addition, since the thickness of the solder joint layer and the amount of Sn in solder can be made proper, the tilt of the cooling device relative to the metal bottom plate can be eliminated or suppressed and a proper solder joint can be attained.

In the present invention, preferably, a plurality of grooves permitting molten solder to flow therein are formed in at least the solder joint area on the inner face of the metal bottom plate. More preferably, the plurality of grooves include a group of grooves extending in substantially the same direction and spaced from one another, and one or more grooves extending such as to cross the group of grooves. With this construction, a solder joint layer can be uniformly formed between the metal bottom plate and the cooling device.

Preferably, the at least one groove or at least one of the plurality of grooves is comprised of a central portion and opposite end portions communicating therewith. At least the central portion extends, as viewed in plan, in the solder joint area on the inner face of the metal bottom plate, and at least one end portion extends off the solder joint area, as viewed in plan, on the inner face of the metal bottom plate. With this construction, solder can be placed in one end portion of the groove, facilitating an operation of forming a solder joint between the metal bottom plate and the cooling device.

More preferably, the groove has its opposite end portions extending off the solder joint area on the inner face of the metal bottom plate. With this structure, air does not remain in the groove during the solder joining operation, so that the solder joint layer can be rapidly formed and the formation of voids in the solder joint layer can be prevented.

Preferably, each groove has a depth of 5 to 120 $\mu$m, more preferably, 10 to 100 $\mu$m. With this arrangement, there is a low possibility that the ability of molten solder to flow in the groove is lowered by an increased viscous resistance of molten solder or by a reduced capillary action of the groove.

Preferably, the area ratio of the groove to a surface of the cooling device on the side facing the metal bottom plate is equal to or larger than 30%. More preferably, the area ratio is equal to or larger than 50%. With this arrangement, molten solder rapidly flows in the groove.

According to another aspect of this invention, there is provided an optical semiconductor device module which comprises the above-mentioned optical semiconductor device package of this invention, an optical semiconductor device accommodated in the package, and a cooling device solder-joined to the solder joint area on the inner face of the metal bottom plate of the package and operable to cool the optical semiconductor device.

With the optical semiconductor device module of this invention, the metal bottom plate and the cooling device are properly solder-joined to each other to provide enhanced adhesion therebetween, so that heat generated by the optical semiconductor device is adequately transferred through the cooling device to the metal bottom plate and dissipated therefrom to the outside, whereby the operation of the optical semiconductor device is stabilized. Since there is a low possibility that the cooling device is inclined relative to the metal bottom plate, a misalignment of the optical axis of the optical semiconductor device and a resulting improper optical signal transmission may not be caused.

DETAILED DESCRIPTION

Figure 3:
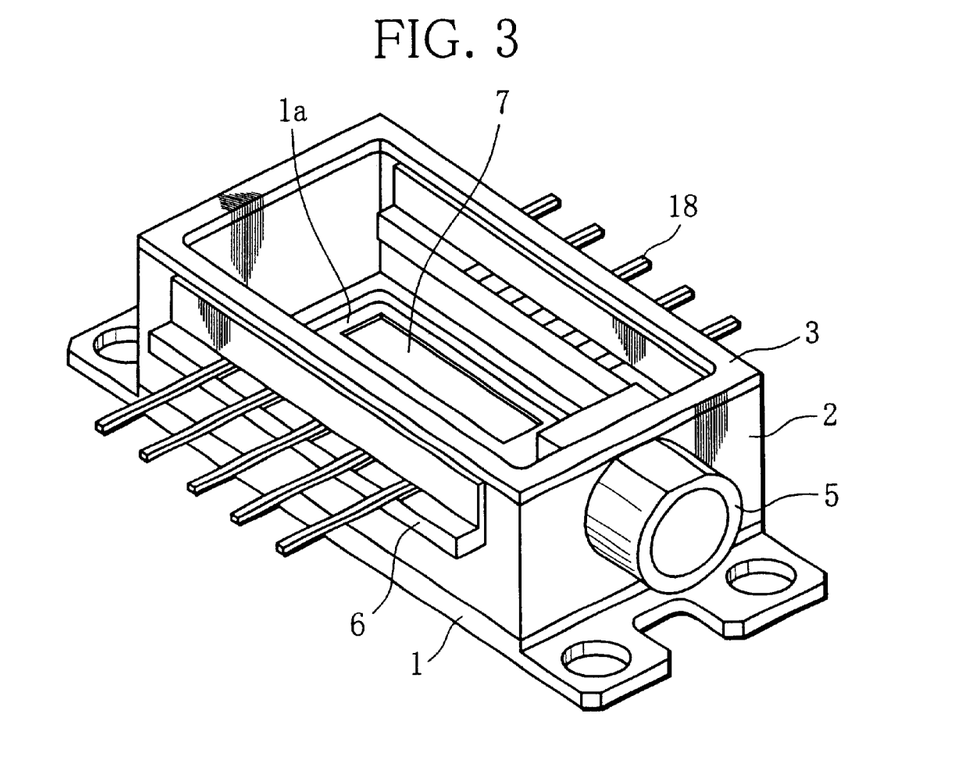
FIG. 3 is a perspective view of an optical semiconductor device package according to an embodiment of this invention.
Figure 4:
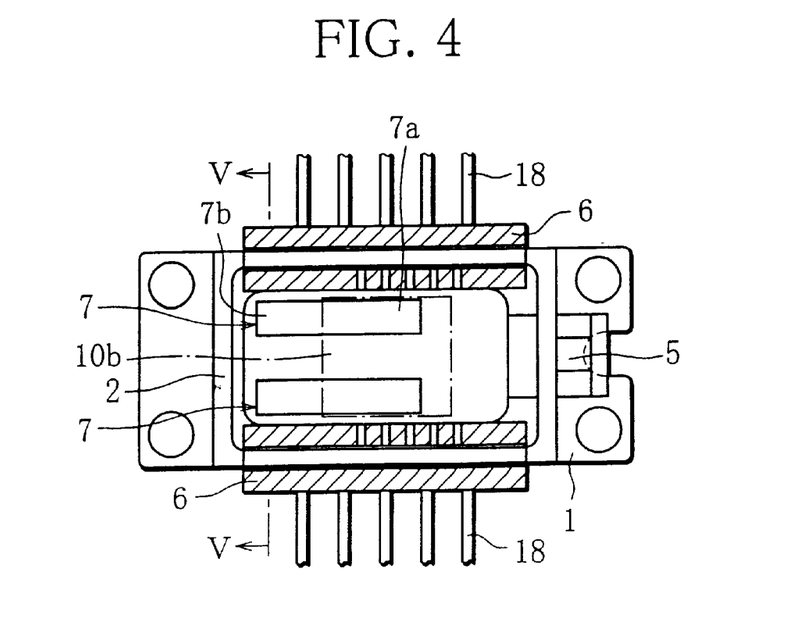
FIG. 4 is a plan view, partly in cross section, of the package shown in FIG. 3.
Figure 5:
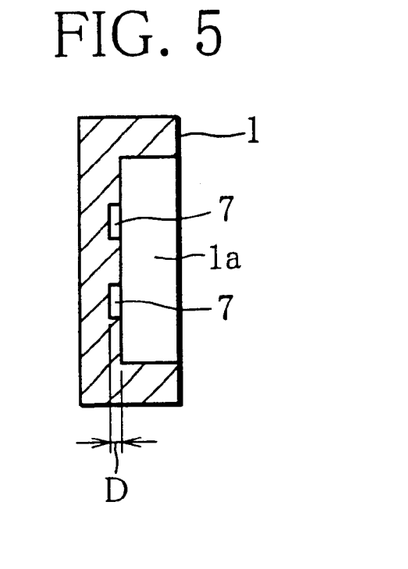
FIG. 5 is a section view taken along line V—V in FIG. 4.

With reference to FIGS. 3–5, an optical semiconductor device module according to an embodiment of this invention will be explained.

The optical semiconductor device module of this embodiment is constructed basically in the same manner as in the conventional module shown in FIG. 1. In brief, the optical semiconductor device module comprises an optical semiconductor device package which is comprised of a metal bottom plate 1 made of a Cu-W alloy and plated with Au, a metal frame 8 to which electric signal input/output sections 7 and a window frame 9 are joined, and a seal ring 3. In the package, various module components, shown in FIG. 1 and including a laser diode (LD) serving as the optical semiconductor device, are solder-joined through a base to a cooling face 10a of a Peltier device 10 serving as the cooling device. The Peltier device 10 has its heat generating face 10b solder-joined to an inner face or upper face of the metal bottom plate 1. In other respects, the optical semiconductor device module is constructed in the same manner as the module shown in FIG. 1.

As shown in FIGS. 3–5, the optical semiconductor device module of this embodiment is featured in that two grooves 7 permitting molten solder to flow thereinto are formed on a part, formed with a recess 1a, of the upper face of the metal bottom plane 1 of the package, and each groove is of a rectangular shape as viewed in plan. The grooves 7 can be formed by machining, electric discharge machining, or etching.

The two grooves 7 extend in parallel to each other along the longitudinal axis of the metal bottom plate 1 and extend beyond the left edge of the lower face 10b of the Peltier device, i.e., the left edge of a solder joint area on the upper face of the metal bottom plate 1, to the outside of the lower face 10b. That is, each groove 7 has a right half portion 7a thereof located beneath the solder joint area and a left half portion 7b thereof located outwardly of the solder joint area. In FIG. 4, the periphery of the lower face 10b of the Peltier device is shown by the dotted chain line.

As already explained, the Peltier device is solder-joined onto the metal bottom plane 1. When solder for the solder joint is heated to melt in respective one end portions of the grooves 3, for instance, molten solder flows in the grooves 3 and penetrates into between and permeates through the upper face of the metal bottom plate 1 and the lower face 10b of the Peltier device, whereby a solder joint layer is formed properly therebetween. The thickness of the solder joint layer observed at other portion of the metal bottom plate than the groove-formed portion thereof is the same as that in the conventional module, for instance, so as not to be too thick.

With the package having the metal bottom plate formed with the grooves 7, an amount of solder available for the formation of the solder joint is larger by an amount flowing into the grooves than that in the conventional package. Hence, the concentration of Au, which diffuses from the metal bottom plate 1, in the solder is lowered, whereby an increased melting point of the solder due to the Au diffusion and occurrences of unmelted solder and voids in the solder joint layer can be prevented or suppressed. As a consequence, the adhesion between the metal bottom plate and the cooling device through the solder joint layer is enhanced, and the degree of inclination of the Peltier device 10 and the LD 16 relative to the metal bottom plate 1 is reduced. Therefore, heat generated by the LD 16 while the optical semiconductor device module is in operation is dissipated to the outside through the Peltier device 10 and the metal bottom plate 1, thereby achieving a stable operation of the LD 16. In addition, there is a low possibility that the optical axis of the LD 16 goes out of alignment to cause improper optical signal transmission in the module. Since unmelted solder and voids do not remain in the solder joint layer, it is unnecessary to use flux to prevent the formation of unmelted solder and voids.

The groove formation pattern in the metal bottom plate 1 is not limited to that in the embodiment and may be modified in various manners.

In the following, four modifications of the groove formation pattern will be explained with reference to FIGS. 6 to 9.

Figure 6:
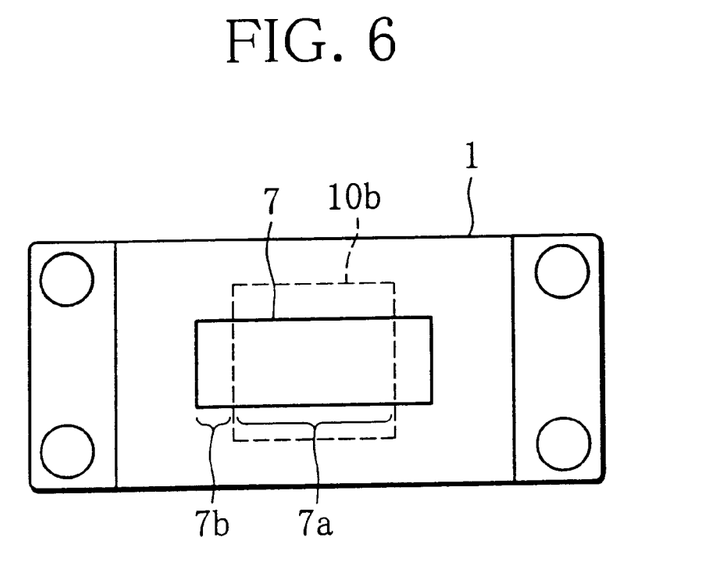
FIG. 6 is a plan view showing a groove forming pattern in a package according to a modification of this invention.

In a package associated with the modification shown in FIG. 6, a single broad groove 7 of a rectangular shape as viewed in plan is formed in the upper face of the metal bottom plate 1 and extends along the longitudinal axis of the metal bottom plate 1. As shown in FIG. 6, the groove 7 has a central portion 7a thereof located beneath the Peltier device 10 and extending in plan between positions corresponding to the right and left edges of the lower face 10b of the Peltier device and opposite end portions 7b thereof extending outwardly from the positions corresponding to the right and left edges of the lower face 10b, respectively. That is, the opposite end portions 7b of the groove 7 protrude from the lower face 10b of the Peltier device.

In this modification, when solder is heated to melt in one or both of the end portions 7b of the groove 7, molten solder flows into the central portion 7a of the groove 7. Subsequently, molten solder overflowing from the groove 7 penetrates into between the upper face of the metal bottom plate 1 and the lower face 10b of the Peltier device, i.e., into a junction interface between the plate and the Peltier device, and permeates through surface layers of these elements, whereby a solder joint layer is formed between the metal bottom plate 1 and the Peltier device 10. Since the opposite end portions of the groove 7 extend off the lower face 10b of the Peltier device, air does not remain in the groove 7 and thus the spread and wetting of molten solder are not hindered by residue air. This achieves a rapid formation of the solder joint layer and reduces a possibility of the presence of voids in the solder joint layer.

Figure 7:
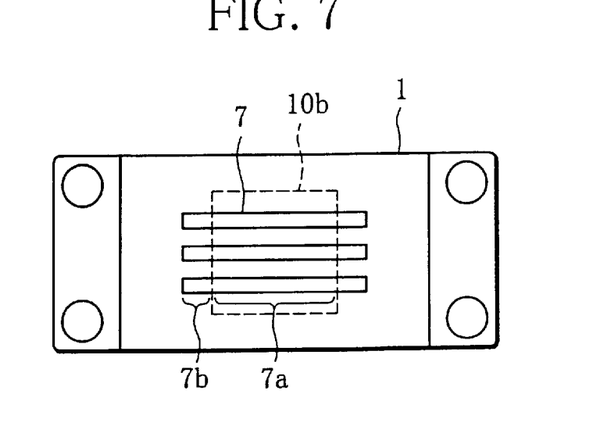
FIG. 7 is a plan view showing a groove forming pattern in another modification.

In another modification shown in FIG. 7, three elongated grooves 7 of a rectangular shape as viewed in plan are formed in the upper face of the metal bottom plate 1 along the longitudinal axis of the metal bottom plate 1. Each of the elongated grooves 7 has a central portion 7a thereof located beneath the Peltier device 10 and extending in plan between the right and left edges of the lower face 10b of the Peltier device, and opposite end portions 7b thereof extending in plan outwardly from the right and left edges of the lower face 10b, respectively.

Figure 8:
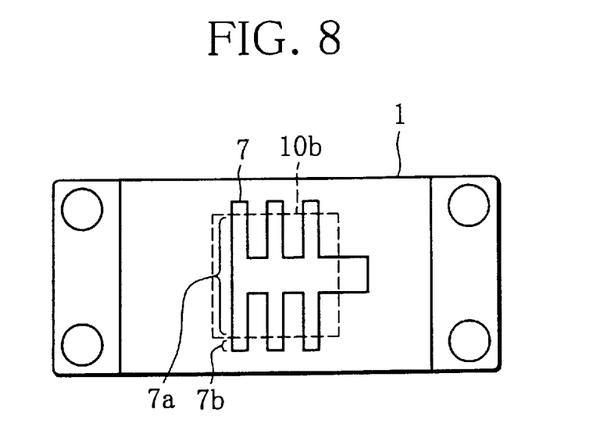
FIG. 8 is a plan view showing a groove forming pattern in a further modification.

Next, in a further modification shown in FIG. 8, a single broad groove 7 of a rectangular planar shape is formed in the upper face of the metal bottom plate 1 along the longitudinal axis of the plate, and three elongated grooves 7 of a rectangular planar shape are formed therein and extend in parallel to one another and in the direction perpendicular to the longitudinal axis of the metal bottom plate 1. The broad groove 7 has its right end portion which extends in plan beyond the right edge of the lower face 10b of the Peltier device. Each of the elongated grooves 7 is comprised of a central portion 7a thereof located beneath the Peltier device 10 and extending in plan between the upper and lower edges of the lower face 10b of the Peltier device, and opposite end portions thereof extending beyond the upper and lower edges of the lower face 10b of the Peltier device, respectively.

Figure 9:
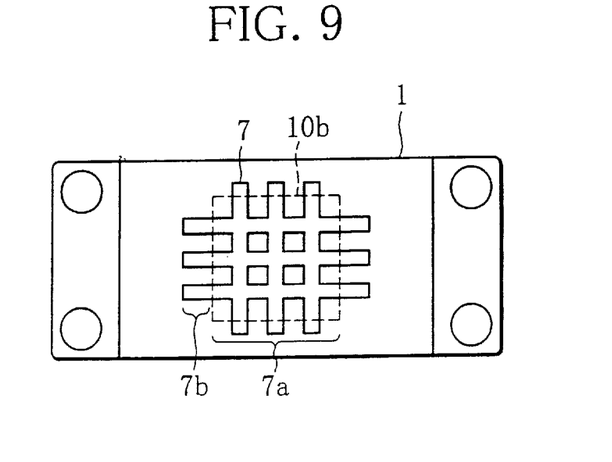
FIG. 9 is a plan view showing a groove forming pattern in a still further modification.

In a further modification shown in FIG. 9, three elongated grooves 7 of a rectangular planar shape are formed in parallel to one another and in the direction of the longitudinal axis of the metal bottom plate 1, and three similar elongated grooves 7 are formed in parallel to one another in the direction perpendicular to the longitudinal axis of the plate. Each of the elongated grooves 7 is comprised of a central portion 7a thereof located beneath the Peltier device 10 and extending in plan between the upper and lower edges or between the right and left edges of the lower face 10b of the Peltier device, and opposite end portions 7b thereof extending in plan outwardly from upper and lower edges or from the right and left edges of the lower face 10b of the Peltier device, respectively.

In the just-mentioned four modifications, a solder joint layer is formed basically in the same manner as in the embodiment shown in FIG. 4, and optical semiconductor device modules having packages of these modifications are operated basically in the same manner as in the embodiment. Thus, explanations as to the structure of the packages and the operation of the modules are omitted.

With regard to the formation of the groove or grooves 7, it is preferable that the area ratio of the groove or grooves 7 (specifically, portions thereof other than one or both of end portions thereof) to the entirety of the lower face 10b of the Peltier device is set to a value not less than 30%, preferably, not less than 50%, from the viewpoint of achieving a rapid inflow of molten solder. Preferably, the depth (shown by symbol D in FIG. 5) of each groove 7 is set to a value ranging from 5 to 120 $\mu$m, more preferably, from 10 to 100 $\mu$m, because the viscous resistance of molten flow becomes large if the groove depth D is less than 10 $\mu$m, in particular less than 5 $\mu$m, and the capillary action of the groove 7 is lowered if the depth D is greater than 100 $\mu$m, in particular greater than 120 $\mu$m, so that the inflow ability of molten solder may be lowered if the depth falls outside the preferable range.

In the following, an optical semiconductor device package of Example 1 of this invention will be explained.

EXAMPLE 1

Nine metal bottom plates 1 of a Cu-W alloy having 30 mm length, 13 mm width, and 1.5 mm thickness were prepared, and one or more grooves 7 were formed in each of the metal bottom plates 1. As shown in Table 1, these plates 1 were different in groove shape (groove formation pattern), groove depth D, and area ratio of the groove to the lower face of the Peltier device from one another, to thereby obtain nine types of metal bottom plate shown by numbers 1 to 9 in Table 1.

Next, a metal frame 2 of covar (a Fe-29 wt % Ni-17 wt % Co alloy) having 20 mm length, 13 mm width, 6 mm height and 1 mm thickness was joined to the upper face of each of the metal bottom plates, electrical signal input/output sections 6 were joined to notches formed in the front and rear walls of each metal frame 2, and a window frame 5 was joined to the right wall of each metal frame 2, whereby package housings were assembled. The joining between the metal bottom plate 1 and the metal frame 2, the joining between the metal frame 2 and the electrical signal input/output sections 6 and the joining between the metal frame 2 and the window frame 5 were performed simultaneously by means of silver soldering. Next, the respective package housings were plated with Ni and Au (2 $\mu$m thickness) in this order, and glass windows (not shown) were sealed in the window frame 5 with use of a low melting point glass, thereby fabricating packages.

Subsequently, a Peltier device, having a lower face of 8 mm width and 10 mm length, was placed on each metal bottom plate 1 and pressed by a weight placed thereon, and Sn—Pb eutectic solder containing rosin flux was disposed in an end portion 7b of one or more grooves extending off the lower face of the Peltier device. Each package was placed in this state on a hot plate by which the package was heated up to 220 degree Celsius, causing the solder to melt. Molten solder flowed into a central portion 7a of each groove located beneath the Peltier device and flowed into the joint interface between the metal bottom plate 1 and the Peltier device. In this manner, packages to which the Peltier devices were individually solder-joined were fabricated.

Thereafter, with regard to each of the fabricated packages, the solder permeation rate at the joint interface and the state of adhesion of solder at the joint interface were examined by using an acoustic microscope, and the parallelism between the Peltier device metal bottom plate was examined. As for the parallelism, the spacing between the lower face of the Peltier device and the metal bottom plate was measured at ten places and determined the maximum spacing, i.e., the difference between the maximum value and the minimum value. If the maximum spacing is not more than 15 $\mu$m, the parallelism between the Peltier device and the metal bottom plate was determined to be satisfactory. A package (shown by number 10 in Table 1) to be compared with the packages according to Example 1 was fabricated by solder-joining a Peltier device thereto by means of a conventional method, and was subject to the same evaluation. The results are shown in Table 1.

TABLE 1

| | No. | Groove shape | Groove depth ($\mu$m) | Groove area ratio (%) | Solder permeation ratio (%) | Adhesion state | Parallelism |
|---|---|---|---|---|---|---|---|
| Example 1 | 1 | FIG. 6 | 50 | 50 | 95 | Good | 6 |
| | 2 | FIG. 7 | 50 | 35 | 90 | Good | 8 |
| | 3 | FIG. 8 | 50 | 55 | 100 | Good | 7 |
| | 4 | FIG. 9 | 50 | 65 | 100 | Good | 4 |
| | 5 | FIG. 8 | 5 | 50 | 90 | Good | 11 |
| | 6 | FIG. 8 | 10 | 55 | 95 | Good | 8 |
| | 7 | FIG. 8 | 30 | 55 | 100 | Good | 6 |
| | 8 | FIG. 8 | 80 | 55 | 100 | Good | 7 |
| | 9 | FIG. 8 | 120 | 55 | 90 | Good | 13 |
| Comparative example | 10 | Without groove | | | 100 | Bad in 40% | 36 |

As apparent from Table 1, the packages of Example 1 of this invention each have a solder permeation rate of more than 90%, and are also satisfactory both in the solder adhesion state and the parallelism between the Peltier device and the metal bottom plate. This is because molten solder rapidly flowed into one or more grooves and hence uniformly permeated through the joint interface between the metal bottom plate and the Peltier device.

Contrary to this, the comparative example has defective solder adhesion places (unmelted solder portion) of about 40% of the entire joint interface, and has poor parallelism. This is because plated Au on the metal bottom plate diffused into the solder foil to cause an increased melting point of solder, resulting in occurrences of unmelted solder in the solder foil.

EXAMPLE 2

Optical semiconductor device modules of a type shown in FIG. 1 were assembled with use of the packages of Example 1, and were put into actual use. Satisfactory optical transmission was made with stability in any of these modules. This is because the Peltier device was solder-joined to the metal bottom plate formed with one or more grooves, with good adhesion and parallelism.

The present invention is not limited to the optical semiconductor device module and the optical semiconductor device module having the same according to the aforementioned embodiment and the modifications thereof, but may be modified in various manners.

For instance, in the embodiment and the modifications thereof, the groove permitting the inflow of molten solder comprises at least one groove of a rectangular planar shape extending along the longitudinal axis of the metal bottom plate and/or at least one groove of a rectangular planar shape extending in the direction perpendicular to the longitudinal axis of the metal bottom plate. Instead of the grooves or in combination with them, the groove permitting the inflow of molten solder may be comprised of at least one groove extending obliquely with respect to the longitudinal axis of the metal bottom plate. Further, the shape of at least one groove which constitutes the groove permitting the inflow of molten solder is not limited to a rectangular shape.

Although the case where this invention is applied to a transmission module has been explained in the embodiment, this invention can be applied to a transmitter/receiver module or a receiver module other than the transmitter module.

In the embodiment, the Peltier device is employed as the cooling device for cooling an optical semiconductor device such as a laser diode. However, this invention can be applied to a package to which a cooling device other than the Peltier device is solder-joined and a module provided with this kind of package.

As already mentioned, this invention can improve both the ability of cooling the optical semiconductor device and the parallelism between the optical semiconductor device and the bottom face of the package. To be noted, a circuit device such as a semiconductor device can be satisfactorily cooled by receiving the circuit device in the package of this invention.

What is claimed is:

1. An optical semiconductor device package including a metal bottom plate having an inner face thereof including a solder joint area for solder joint between the metal bottom plate and a cooling device for cooling an optical semiconductor device, a metal frame joined to a peripheral portion of the inner face of the metal bottom plate and cooperating with the metal bottom plate to define an accommodation space for accommodating therein the optical semiconductor device and the cooling device, a window frame formed integrally with the metal frame and employed for optical signal transmission between the optical semiconductor device and an external device, and an electric signal input/output section formed integrally with the metal frame and employed for electric signal transmission between the optical semiconductor device and an external device, the improvement comprising:

at least one groove permitting molten solder to flow therein being formed in at least part of the solder joint area on the inner face of the metal bottom plate.

2. The package according to claim 1, wherein a plurality of grooves permitting molten solder to flow therein are formed in at least the solder joint area on the inner face of the metal bottom plate.

3. The package according to claim 2, wherein the plurality of grooves include a group of grooves extending in substantially the same direction and spaced from one another.

4. The package according to claim 3, wherein the plurality of grooves include one or more grooves extending such as to cross the group of grooves.

5. The package according to any of claims 1–4, wherein said at least one groove or at least one of the plurality of grooves is comprised of a central portion and opposite end portions communicating therewith, at least the central portion extends, as viewed in plan, in the solder joint area on the inner face of the metal bottom plate, and at least one of the end portions extends off the solder joint area, as viewed in plan, on the inner face of the metal bottom plate.

6. The package according to claim 5, wherein said at least one groove or at least one of the plurality of grooves has its opposite end portions extending off the solder joint area on the inner face of the metal bottom plate.

7. The package according to any of claims 1–4, wherein said at least one groove or at least one of the plurality of grooves has a depth of 5 to 120 μm.

8. The package according to claim 5, wherein said at least one groove or at least one of the plurality of grooves has a depth of 5 to 120 μm.

9. The package according to any of claims 1–4, wherein an area ratio of said at least one groove or at least one of the plurality of grooves to a surface of the cooling device on a side facing the metal bottom plate is equal to or larger than 30%.

10. The package according to claim 5, wherein an area ratio of said at least one groove or at least one of the plurality of grooves to a surface of the cooling device on a side facing the metal bottom plate is equal to or larger than 30%.

11. An optical semiconductor device module comprising:
an optical semiconductor device package;
an optical semiconductor device accommodated in the package; and
a cooling device solder-joined to a solder joint area on an inner face of a metal bottom plate of the package and operable to cool the optical semiconductor device, wherein
said optical semiconductor device package including a metal bottom plate having an inner face thereof including a solder joint area for solder joint between the metal bottom plate and a cooling device for cooling an optical semiconductor device, a metal frame joined to a peripheral portion of the inner face of the metal bottom plate and cooperating with the metal bottom plate to define an accommodation space for accommodating therein the optical semiconductor device and the cooling device, a window frame formed integrally with the metal frame and employed for optical signal transmission between the optical semiconductor device and an external device, and an electric signal input/output section formed integrally with the metal frame and employed for electric signal transmission between the optical semiconductor device and an external device, the improvement comprising:

at least one groove permitting molten solder to flow therein being formed in at least part of the solder joint area on the inner face of the metal bottom plate.

12. The optical semiconductor device module according to claim 11, wherein said optical semiconductor device package includes a plurality of grooves permitting molten solder to flow therein are formed in at least the solder joint area on the inner face of the metal bottom plate.

13. The optical semiconductor device module according to claim 11, wherein said at least one of the plurality of grooves is comprised of a central portion and opposite end portions communicating therewith, at least the central portion extends, as viewed in plan, in the solder joint area on the inner face of the metal bottom plate, and at least one of the end portions extends off the solder joint area, as viewed in plan, on the inner face of the metal bottom plate.

14. The optical semiconductor device module according to claim 13, wherein said at least one of the plurality of grooves has its opposite end portions extending off the solder joint area on the inner face of the metal bottom plate.

15. The optical semiconductor device module according to claim 11, wherein said at least one of the plurality of grooves has a depth of 5 to 120 $\mu$m.

16. The optical semiconductor device module according to claim 13, wherein said at least one of the plurality of grooves has a depth of 5 to 120 $\mu$m.

17. The optical semiconductor device module according to claim 11, wherein said area ratio of said at least one of the plurality of grooves to a surface of the cooling device on a side facing the metal bottom plate is equal to or larger than 30%.

18. The optical semiconductor device module according to claim 13, wherein said area ratio of said at least one of the plurality of grooves to a surface of the cooling device on a side facing the metal bottom plate is equal to or larger than 30%.

19. The optical semiconductor device module according to claim 11, wherein the plurality of grooves include a group of grooves extending in substantially a same direction and spaced from one another.

20. The optical semiconductor device module according to claim 19, wherein the plurality of grooves include one or more grooves extending such as to cross the group of grooves.

* * * * *